United States Patent
Shiba et al.

(10) Patent No.: US 8,330,242 B2
(45) Date of Patent: Dec. 11, 2012

(54) SEMICONDUCTOR LIGHT-RECEIVING ELEMENT

(75) Inventors: Kazuhiro Shiba, Tokyo (JP); Junichi Fujikata, Tokyo (JP)

(73) Assignee: NEC Corporation, Tokyo (JP)

( * ) Notice: Subject to any disclaimer, the term of this patent is extended or adjusted under 35 U.S.C. 154(b) by 285 days.

(21) Appl. No.: 12/919,551

(22) PCT Filed: Mar. 5, 2009

(86) PCT No.: PCT/JP2009/000991
§ 371 (c)(1),
(2), (4) Date: Aug. 26, 2010

(87) PCT Pub. No.: WO2009/119012
PCT Pub. Date: Oct. 1, 2009

(65) Prior Publication Data
US 2010/0327385 A1 Dec. 30, 2010

(30) Foreign Application Priority Data
Mar. 28, 2008 (JP) .................................. 2008-087574

(51) Int. Cl.
*G02B 6/26* (2006.01)
(52) U.S. Cl. .......................................... 257/432; 385/14
(58) Field of Classification Search .................. 257/432; 385/2, 12, 14
See application file for complete search history.

(56) References Cited

U.S. PATENT DOCUMENTS

| | | | | |
|---|---|---|---|---|
| 4,725,870 A | * | 2/1988 | Bean et al. | 257/19 |
| 5,682,455 A | * | 10/1997 | Kovacic et al. | 385/131 |
| 5,747,860 A | * | 5/1998 | Sugiyama et al. | 257/432 |
| 5,796,118 A | * | 8/1998 | Morikawa et al. | 257/19 |
| 6,778,723 B1 | * | 8/2004 | Yang | 385/16 |

FOREIGN PATENT DOCUMENTS

| | | |
|---|---|---|
| JP | 2004349350 A | 12/2004 |
| JP | 2006522465 A | 9/2006 |
| WO | 2006066611 A | 6/2006 |

OTHER PUBLICATIONS

Jalali et al., "Si-based receivers for optical data links," Journal of Lightwave Technology, vol. 12, No. 6, pp. 930-935, Jun. 1994.*
Splett et al., "Integration of waveguides and photodetectors in SiGe for 1.3 micron operation," Photonics Technology Letters, IEEE, vol. 6, No. 1, pp. 59-61, Jan. 1994.*
Jalali et al., "SiGe waveguide photodetectors grown by rapid thermal chemical vapour deposition," Electronics Letters, vol. 28, No. 3, pp. 269-271, Jan. 30, 1992.*

(Continued)

*Primary Examiner* — Thomas L Dickey

(57) ABSTRACT

The Si waveguide 305 includes a first conductivity-type Si layer 301 and an intrinsic Si layer 302, and a second conductivity-type light-absorption layer 303 is partially formed on an area thereof. During operation, a reverse bias is applied between the first conductivity-type Si layer 301 and the light-absorption layer 303. Since the light-absorption layer 303 has a conductivity type, it is not depleted when a voltage is applied, but the intrinsic Si layer 302 forming the Si waveguide 305 is depleted. Therefore, it is possible to reduce a CR time constant. Furthermore, since the intrinsic Si layer 302 can be formed on the first conductivity-type Si layer 301 in a continuous manner, it is possible to reduce lattice defects. As a result, it is possible to suppress the dark current generated in the light-receiving element.

8 Claims, 11 Drawing Sheets

SIGNAL LIGHT

OTHER PUBLICATIONS

International Search Report for PCT/JP2009/000991 mailed Apr. 7, 2009.
S. Park et al., "Ge photodetectots integrated with Si waveguides via selective epitaxial growth", The 68th Autumn Meeting, The Japan Society of Applied Physics, No. 0, 6p-C-7, 2007, p. 89.
G. Masini et al., "Near-infrared waveguide photodetectors based on polycrystalline Ge on silicon-on-insulator substrates", Optical Materials, vol. 17, 2001, p. 243-246.

* cited by examiner

SIGNAL LIGHT

SEMICONDUCTOR LIGHT-RECEIVING ELEMENT

TECHNICAL FIELD

The present invention relates to a semiconductor light-receiving element.

BACKGROUND ART

Since a Si waveguide is strongly resistant to bending, it is prospectively used as an optical waveguide in a microscopic region. In addition, a light-receiving element that can be integrated with the Si waveguide is being sought. Characteristics required in such a light-receiving element include reduction of a dark current, highly efficient photoelectric conversion, and easy integration with the Si waveguide.

Reduction of the dark current is important to improve reception sensitivity. In a light-receiving element having a large dark current, an electric current flows even when light is not incident. This becomes a noise component and generates degradation of the reception sensitivity due to the determination of the S/N ratio. Generally, the light-absorption layer of the light-receiving element combined with the Si waveguide is made of Ge. However, since the Ge has a different lattice constant from that of Si, when the light-absorption layer is integratedly formed on the Si, the dark current increases due to lattice defects or the like.

In addition, highly efficient photoelectric conversion is also important. Particularly, the reception sensitivity is associated with efficiency of the element. As the efficiency increases, it is possible to obtain a higher reception sensitivity. As an example of methods for improving the efficiency, it was proposed to employ an Avalansche photo diode (APD) structure having an amplification function. A high voltage is to be applied to the element to obtain an APD operation. However, in this case, since a high electric field is applied to a Ge absorption layer having a lot of defects, the dark current increases, and the sensitivity is degraded.

As described above, development of a highly efficient element having a low dark current and a high integration capability with the Si waveguide as an optical guide is sought.

In Non-patent Document 1, a Ge photodetector integrated with the Si waveguide using a selective growth has been reported. FIG. 11 is a perspective view illustrating a light-receiving element described in this report. In this light-receiving element, an intrinsic Ge layer 201 as an absorption layer is formed on the rib type Si waveguide 203 using a selective growth, and an n-type Ge layer 202 as a contact layer is formed thereon. An electrode 206 is formed on the n-type Ge layer 202, and an electrode 205 is also formed on the Si waveguide 203. The Si waveguide 203 is a p-type. As described above, when Ge is grown on Si, because both elements have different lattice constants, crystallinity of Ge is not satisfactory. In this document, since the intrinsic Ge layer 201 is selectively grown only in the microscopic region on the Si waveguide 203, generation of lattice defects within the intrinsic Ge layer 201 is suppressed.

[Non-patent Document 1] 68th Japan Society of Applied Physics Meetings, Pamphlet No. 0 P. 89 6p-C-7, "Ge photo-detectors integrated with Si waveguides via selective epitaxial growth," by Sung-bong, Park

DISCLOSURE OF THE INVENTION

In the technology disclosed in the aforementioned document, it is necessary to thicken the intrinsic Ge layer in order to obtain high efficiency. In this case, lattice defects are generated. Furthermore, in the element operation state, since the intrinsic Ge layer susceptible to lattice defects is depleted, the dark current increases. Therefore, even when the amplification is generated, the sensitivity is not improved.

The present invention has been made to solve the aforementioned problems and provides a highly efficient semiconductor light-receiving element that has a low dark current and can be readily integrated with the Si waveguide.

According to the present invention, there is provided a semiconductor light-receiving element including: a Si waveguide obtained by stacking a first conductivity-type Si layer and an intrinsic Si layer; and a light-absorption layer stacked on a part of an area of the intrinsic Si layer and made of any one of a second conductivity-type Ge, a second conductivity-type SiGe, and a multi-layer film obtained by alternately stacking a second conductivity-type Ge layer and a second conductivity-type Si layer.

According to the present invention, it is possible to provide a highly efficient semiconductor light-receiving element that has a low dark current and can be readily integrated with the Si waveguide.

BRIEF DESCRIPTION OF DRAWINGS

The aforementioned and other objects, advantages, and characteristics will be more apparent by referring to the preferred embodiments the accompanying drawings which will be described below.

BEST MODE FOR CARRYING OUT THE INVENTION

Figure 1:
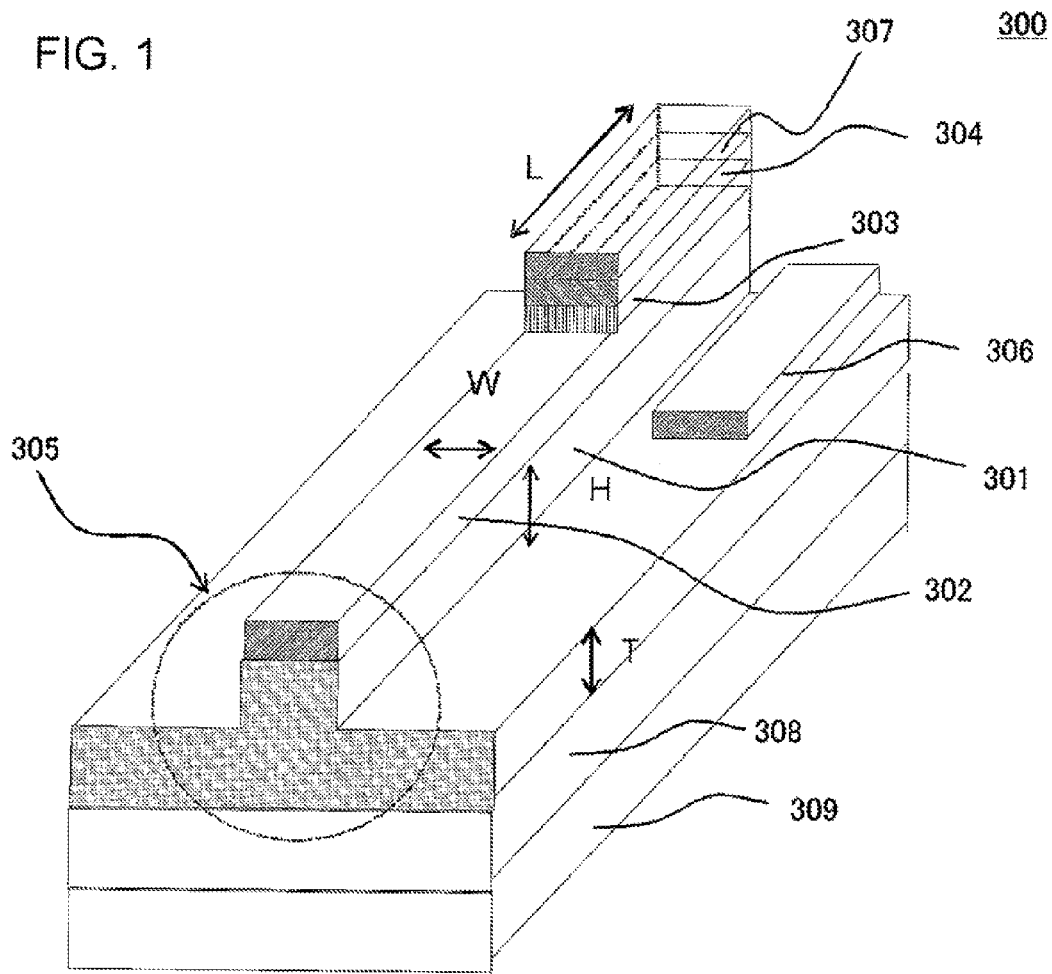
FIG. 1 is a perspective view illustrating a semiconductor light-receiving element 300 according to the first embodiment.

Hereinafter, embodiments of the present invention will be described with reference to the accompanying drawings, in which like reference numerals denote like elements, and descriptions thereof will be omitted.

(First Embodiment)

Figure 2:
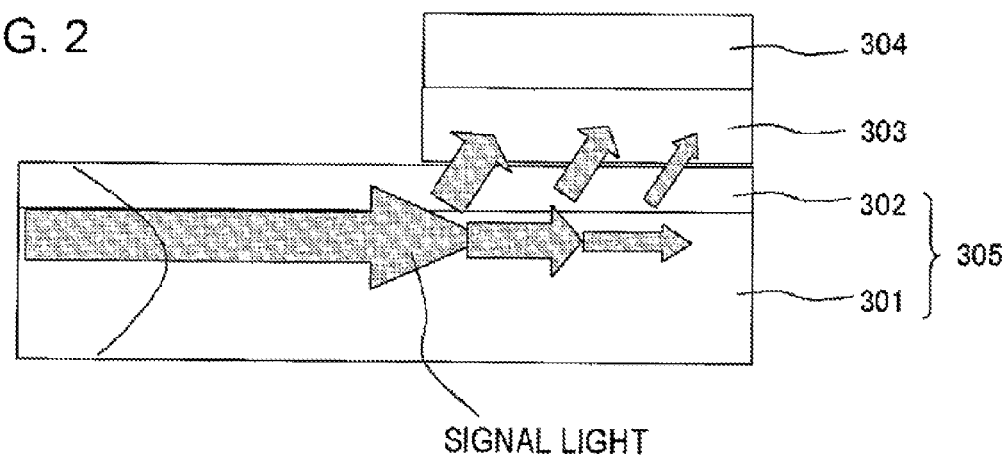
FIG. 2 is a cross-sectional view cutting the center of the waveguide along the longitudinal direction of the waveguide of FIG. 1.

FIG. 1 is a perspective diagram illustrating a semiconductor light-receiving element 300 according to the first embodiment. FIG. 2 is a cross-sectional diagram cutting the center of the waveguide of FIG. 1 along the longitudinal direction of the waveguide. The semiconductor light-receiving element 300 includes a Si waveguide 305 and a light-absorption layer 303. The Si waveguide 305 is a stack structure including a first conductivity-type Si layer 301 and an intrinsic Si layer 302. The light-absorption layer 303 is made of second conductivity-type Ge and stacked on a part of the intrinsic Si layer 302. In addition, the light-absorption layer 303 may be made of either a second conductivity-type SiGe layer or a multi-layer obtained by alternately stacking a second conductivity-type Ge layer and a second conductivity-type Si layer. In such a semiconductor light-receiving element, it is possible to integrate it with the Si waveguide 305 and implement a light-receiving element structure having a low dark current and a high sensitivity. Hereinafter, detailed descriptions thereof will be described.

The Si waveguide 305 is formed on the $SiO_2$ layer 308 provided on the Si substrate 309. The first conductivity-type Si layer 301 is a rib type, and the intrinsic Si layer 302 is formed on a surface of a convex portion of the first conductivity-type Si layer 301. In addition, the electrode 306 is formed on a hem area of the first conductivity-type Si layer 301, and the second conductivity-type Si layer 304 and the electrode 307 are stacked on the light-absorption layer 303 in this order. When the semiconductor light-receiving element 300 is operated, a reverse bias is applied between the electrodes 306 and 307. In this state, as shown in FIG. 2, the incident light is weepingly absorbed in the light-absorption layer 303 and converted into an electric current while guided by the Si waveguide 305 underlying the light-absorption layer 303. In this way, since the incident light is diffusedly absorbed in the light-absorption layer 303, the high input light power durability is also excellent. As a result, in optical wiring as an application field of the present element, there is a smaller number of split points in a path from the emission laser to the light-receiving element, and it is possible to suppress degradation of the semiconductor light-receiving element 300 even when semiconductor light-receiving element 300 is arranged at a location where a high power light is input. Therefore, it is possible to further suppress degradation of a frequency characteristic.

When the semiconductor light-receiving element 300 is operated, the intrinsic Si layer 302 adjacent to the light-absorption layer 303 is depleted. Particularly, the depletion region is located only beneath the light-absorption layer 303. That is, since the depletion region is formed on the intrinsic Si layer 302 by applying a reverse bias, it is possible to reduce the CR time constant as an index for determining the high speed responsiveness of the light-receiving element. As a result, it is possible to provide a high speed response.

In addition, in a conventional structure, the Ge absorption layer susceptible to lattice defects is depleted. On the contrary, in the present embodiment, the depletion region is formed in the intrinsic Si layer 302 that is not susceptible to lattice defects, and the light-absorption layer 303 is conductive and not depleted. Therefore, it is possible to suppress the dark current from increasing and improve reliability.

Furthermore, when the reverse bias increases, ionization is multiplied within the depleted intrinsic Si layer 302. As a result, it is possible to advantageously obtain an APD operation.

For example, when the thickness of the intrinsic Si layer 302 is 0.2 μm, the intensity of the electric field accordingly increases to 100 KV/cm, 500 KV/cm, and 1000 KV/cm as the voltage applied to the intrinsic Si layer 302 increases to 2 V, 10 V, and 20 V, respectively. As a result, when the electric field intensity is equal to or higher than 500 KV/cm in an operational state in which a high electric-field is applied, for example, when a voltage equal to or higher than 10 V is applied, ionization is multiplied in the intrinsic Si layer 302. As a result, electrons of carriers generated in the light-absorption layer 303 propagate to the intrinsic Si layer 302 where the electric field is applied and have an internal gain due to ionization multiplication.

In addition, since the second conductivity-type Si layer 304 is provided between the electrode 307 and the light-absorption layer 303, it is possible to reduce contact resistance between the electrode 307 and the light-absorption layer 303.

It is preferable that the impurity concentration of the light-absorption layer 303 in the vicinity of an interface with intrinsic Si layer 302 is lower than that in the vicinity of the opposite interface thereof. In this structure, an internal electric field is generated within the light-absorption layer 303 depending on the difference of the Fermi level according to the difference of the impurity concentration. As a result, carriers generated in the light-absorption layer 303 travel due to the internal electric field. Therefore, it is possible to shorten the traveling time and obtain a high speed.

In addition, when the second conductivity-type SiGe layer is used in the light-absorption layer 303, the lattice constant of the light-absorption layer 303 becomes close to that of Si. Therefore, it is possible to improve crystallinity of the light-absorption layer 303.

Furthermore, when the light-absorption layer 303 includes a thin-film multi-layer structure obtained by alternately stacking a conductive Si layer and a conductive Ge layer or a conductive SiGe layer, it is possible alleviate the strain within the conductive Ge layer or the conductive SiGe layer. Therefore, even when the total thickness of the stack film exceeds a critical film thickness in a single layer, it is possible to form an excellent crystal structure having a small number of lattice defects. Therefore, it is possible to reduce the dark current and improve photoelectric conversion efficiency.

When the first conductivity-type is an n-type, and the second conductivity-type is a p-type, only electrons having a high traveling speed among carriers generated in the light-absorption layer 303 travel within the light-absorption layer 303. In addition, among the generated carriers, only electrons having a high traveling speed travel from the light-absorption layer 303 through the depletion region formed in the intrinsic Si layer 302. Therefore, it is possible to achieve a high speed of the semiconductor light-receiving element 300.

Meanwhile, when the first conductivity-type is a p-type, and the second conductivity-type is an n-type, the thickness of the intrinsic Si layer 302 is preferably equal to or smaller than 200 nm. When the first conductivity-type is a p-type, and the second conductivity-type is an n-type, the light-absorption layer 303 and the second conductivity-type Si layer 304 becomes an n-type. Therefore, it is possible to reduce a contact resistance with the electrode 307. As a result, it is possible to reduce a CR time constant of the semiconductor light-receiving element 300 and obtain a high speed response of the semiconductor light-receiving element 300.

Meanwhile, in this structure, an electric field is not applied to the light-absorption layer 303 during the operation. In addition, among the carriers generated in the light-absorption layer 303 by the light absorption, only holes proceed into the intrinsic Si layer 302. Here, when the voltage applied during the element operation increases, the electric field applied to the intrinsic Si layer 302 also increases. Ionization multiplication is generated within the intrinsic Si layer 302 by the electric field applied to the intrinsic Si layer 302, and a gain is obtained.

Since the multiplication rate of electrons is higher than that of holes in Si, it is preferable that electrons are injected into the intrinsic Si layer 302 interposed between the light-absorption layer 303 and the first conductivity-type Si layer 301. However, when the first conductivity-type is an n-type, holes are injected to the intrinsic Si layer 302 as described above. In this regard, by make the intrinsic Si layer 302 thin, it is possible suppress degradation of a high frequency response caused by the increasing multiplication time. Here, it is preferable that the intrinsic Si layer 302 has a thickness equal to or smaller than 200 nm.

In addition, the core width W (the width of the convex portion) of the first conductivity-type Si layer 301 is set to, for example, 0.5 to 5 μm, and the core height H is set to, for example, 0.1 to 2 μm. The height T of the hem is, for example, equal to or larger than 0.5 μm. The thickness of the intrinsic Si layer 302 is set to, for example, 0.1 to 1 μm. The length L of the light-absorption layer 303 is set to, for example, 5 to 50 μm.

Figure 3:
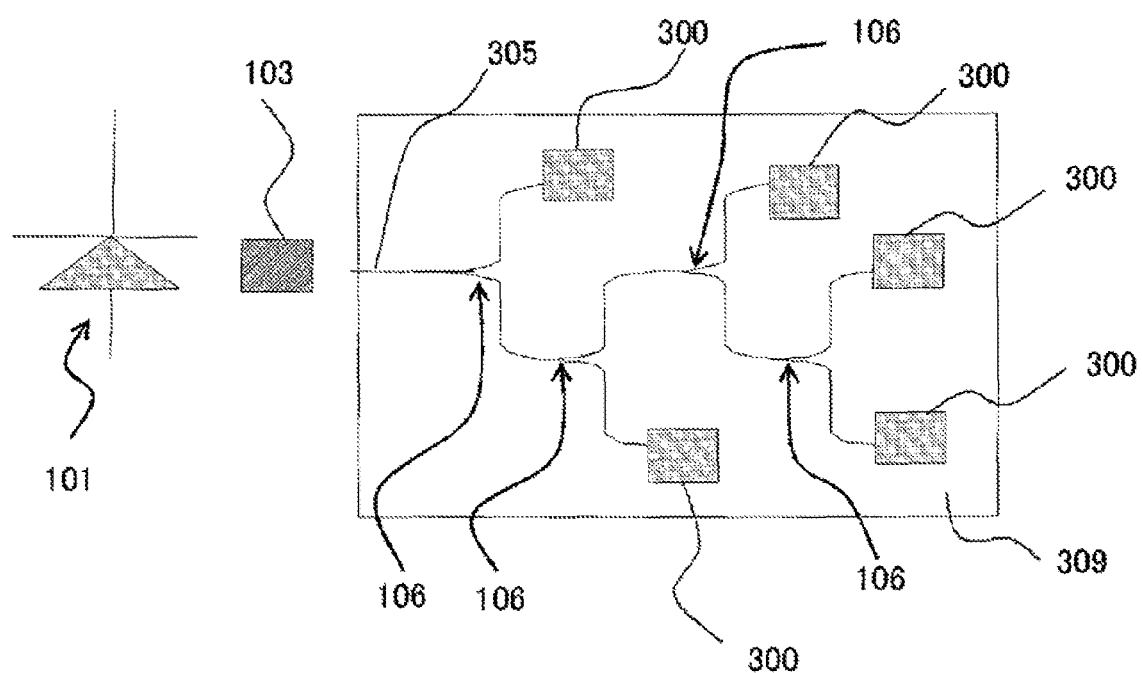
FIG. 3 is an example of a light-receiving system using a semiconductor light-receiving element 300.

FIG. 3 illustrates an exemplary light-receiving system using the semiconductor light-receiving element 300. A semiconductor laser 101 is used in the transmission side. The semiconductor laser 101 is mounted with high accuracy on the Si substrate 309 where the Si waveguide 305 is formed. The light emitted from the semiconductor laser 101 is incident to the Si waveguide 305. The incident light is modulated by the modulator 103 integrated into the Si waveguide 305 or mounted in the Si waveguide 305 and guided by the Si waveguide 305 so as to be transmitted to each semiconductor light-receiving element 300.

In this case, in the path of the Si waveguide 305 from the semiconductor laser 101 to the semiconductor light-receiving element 300, there are several branches 106 where a signal is slightly attenuated. Therefore, there is a limitation to the number of branches. On the other hand, it is necessary to increase the number of semiconductor light-receiving elements 300 by increasing the number of branches in order to obtain a high performance circuit. In order to obtain the high performance circuit by cutting off such a tradeoff relationship, it is necessary to increase the power of light emitted from the semiconductor laser 101 or prepare a high performance semiconductor light-receiving element 300. As described above, in the present embodiment, the semiconductor light-receiving element 300 has a high performance. Therefore, it is possible to increase the upper limitation of the number of branches.

The signal light intensity changes depending on the number of branches until the light arrives in each semiconductor light-receiving element 300. However, as described with reference to FIG. 2, even when the number of branches is small in the path from the emitted laser to the light-receiving element, and the semiconductor light-receiving element 300 is arranged in the position where strong light is incident, it is possible to suppress degradation of the semiconductor light-receiving element 300.

In addition, according to the present embodiment, the intrinsic Si layer 302 may be formed on the entire surface of the first conductivity-type Si layer 301.

Figure 4:
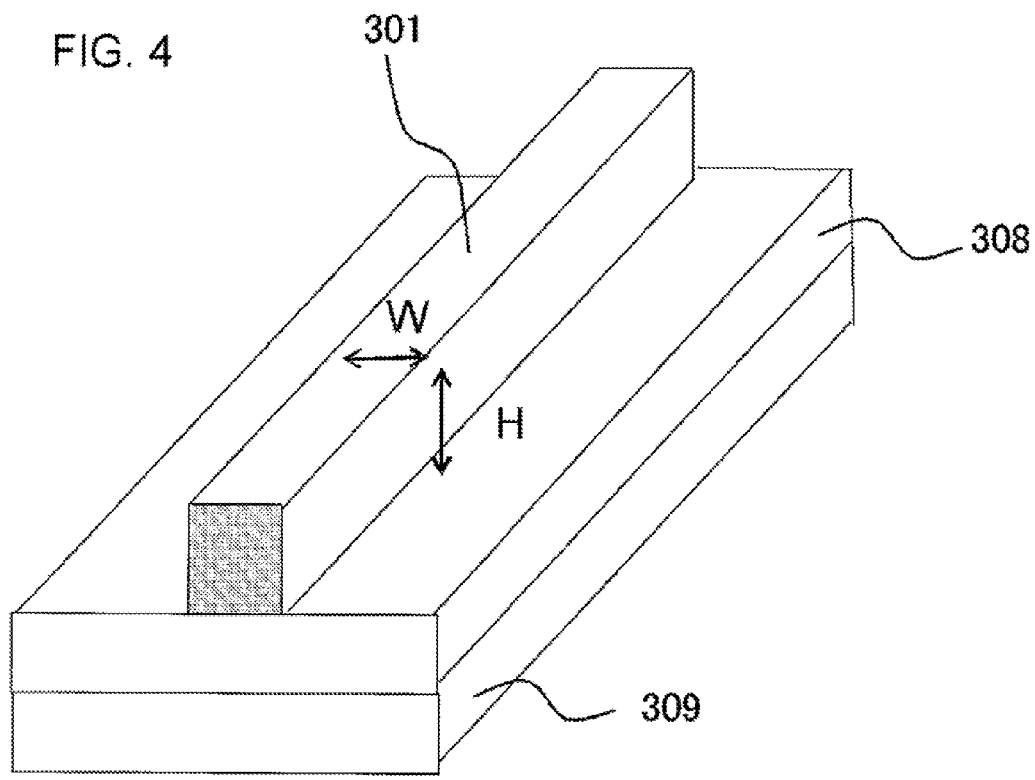
FIG. 4 illustrates another example of a Si waveguide 305.

In addition, the first conductivity-type Si layer 301 of the Si-waveguide 305 may be a narrow line type waveguide as shown in FIG. 4. In this case, the width W of the first conductivity-type Si layer 301 is set to, for example, 0.3 to 0.6 μm, and the height H is set to, for example, 0.1 to 0.4 μm. In addition, in the drawing, while illustration of a portion overlying the first conductivity-type Si layer 301 is omitted, a structure of a portion overlying the first conductivity-type Si layer 301 is similar to that of FIG. 1.

Hereinbefore, according to the present embodiment, the Si waveguide 305 is structured by stacking the first conductivity-type Si layer 301 and the intrinsic Si layer 302, and the second conductivity-type light-absorption layer 303 is formed on the intrinsic Si layer 302. Therefore, the light-absorption layer 303 is not depleted, but the intrinsic Si layer 302 is depleted. Therefore, it is possible to suppress the dark-current from increasing.

Furthermore, since an APD operation can be made, it is possible to achieve a high efficiency photoelectric conversion. Since the first conductivity-type Si layer 301, the intrinsic Si layer 302, and the light-absorption layer 303 are stacked in this order, it can be readily integrated with the Si waveguide.

Therefore, it is possible to provide a semiconductor light-receiving element that has a low dark current characteristic and a high speed characteristic and can be readily integrated with the Si waveguide.

(Second Embodiment)

Figure 5:
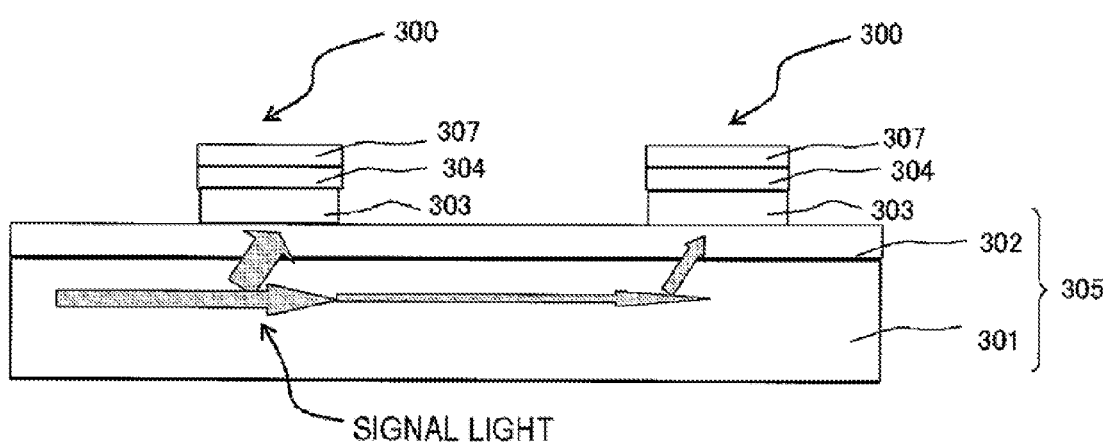
FIG. 5 is a cross-sectional view illustrating a configuration of a semiconductor light-receiving element according to the second embodiment.

FIG. 5 is a cross-sectional diagram illustrating a configuration of the semiconductor light-receiving element according to the second embodiment. This semiconductor light-receiving element is structured by arranging a plurality of the semiconductor light-receiving elements 300 described in the first embodiment in series along a longitudinal direction of the Si waveguide 305.

In this semiconductor light-receiving element, the incident light is absorbed in each of a plurality of the semiconductor light-receiving elements 300 while being guided by the Si waveguide 305. Since the incident light is absorbed by the semiconductor light-receiving element 300 while being guided, the signal detection intensity of the semiconductor light-receiving element 300 located relatively in front is higher than that of the semiconductor light-receiving element 300 located relative in rear. In this case, by setting the length of the semiconductor light-receiving element 300 located relatively in front to be shorter than that of the semiconductor light-receiving element 300 located relatively in rear, it is possible to equalize the light absorption amount of each semiconductor light-receiving element 300 to adjust the reception sensitivity. In addition, by setting the voltage applied to the semiconductor light-receiving element 300 located relatively in front to be smaller than that of the semiconductor light-receiving element 300 located relatively in rear, it is possible to equalize the light absorption amount of each semiconductor light-receiving element 300 to adjust the reception sensitivity.

As a result, it is possible to increase the number of receiver ports on the wire line without increasing the number of branches.

(Third Embodiment)

Figure 6:
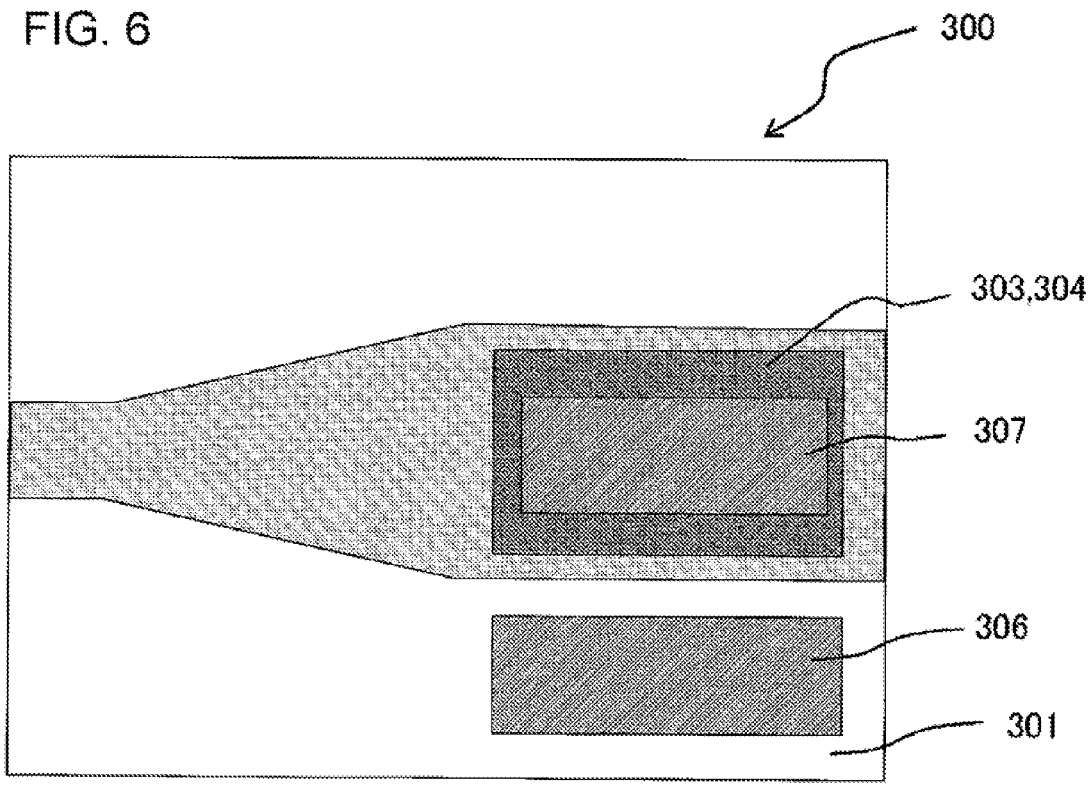
FIG. 6 is a top plan view illustrating a configuration of a semiconductor light-receiving element according to the third embodiment.

FIG. 6 is a top plan view illustrating a configuration of the semiconductor light-receiving element 300 according to the third embodiment. In the present embodiment, the semiconductor light-receiving element 300 has a similar configuration to that of the first embodiment except that the width of the convex portion of the first conductivity-type Si layer 301 in the areas of the light-absorption layer 303, the second conductivity-type Si layer 304, and the electrode 307 is larger than that of other portions.

According to the present embodiment, it is possible to obtain the same effect as those of the first embodiment. In addition, since the carriers can be diffusedly generated in the light-absorption layer 303, a high input light power durability can be obtained.

(Fourth Embodiment)

Figure 7:
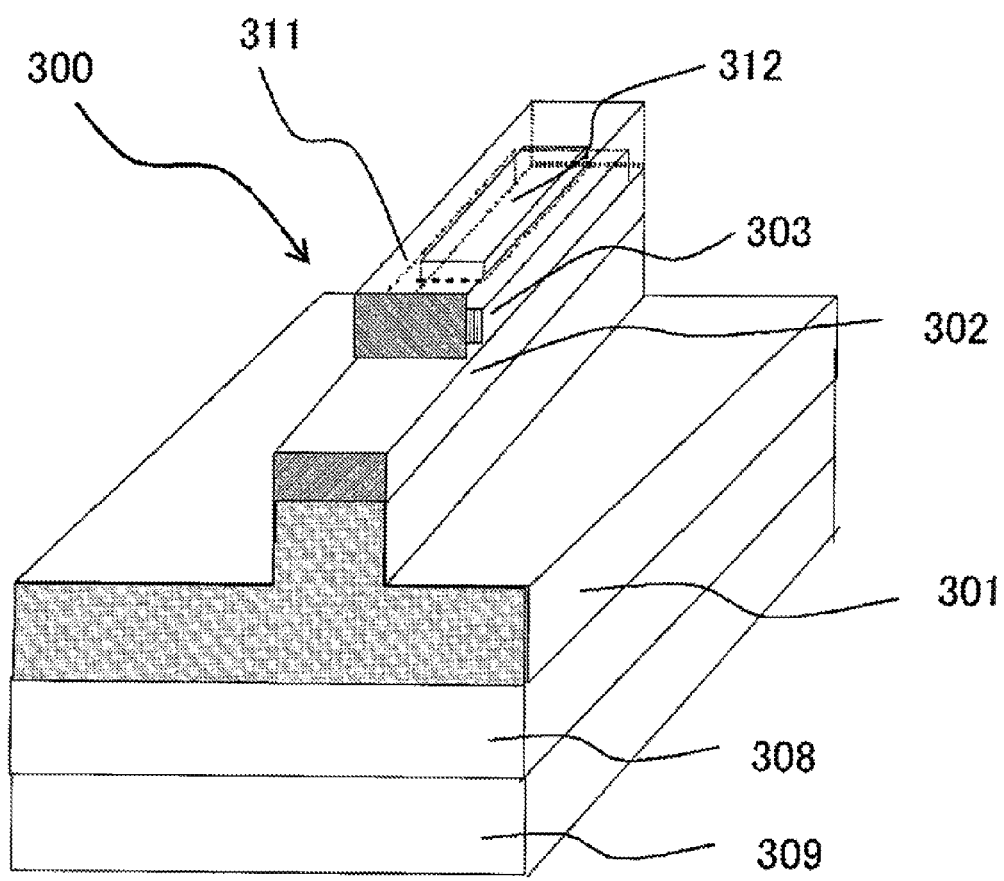
FIG. 7 is a perspective diagram illustrating a configuration of a semiconductor light-receiving element 300 according to the fourth embodiment.

FIG. 7 is a perspective view illustrating a semiconductor light-receiving element 300 according to the fourth embodiment. In the present embodiment, the semiconductor light-receiving element 300 has a similar configuration as that of the first embodiment except that a cover layer 311 formed of a material having a thermal expansion rate lower than that of the light-absorption layer 303 is provided on the intrinsic Si layer 302 to surround the light-absorption layer 303. In the example shown in the drawing, while the cover layer 311 is made of Si (for example, intrinsic Si), a second conductivity-type region 312 is provided in a part of the cover layer 311. The second conductivity-type region 312 is located under the electrode 307. In addition, in the drawing, the second conductivity-type Si layer 304 and the electrode 307 are omitted.

In this configuration, if a heat treatment is applied to the semiconductor light-receiving element 300, a strain of the light-absorption layer 303 increases because the thermal expansion rate of the cover layer 311 is different from the thermal expansion rate of the light-absorption layer 303. As a result, a light absorption coefficient of the light-absorption layer 303 increases at a long-wavelength range (for example, a wavelength equal to or larger than 1.55 µm). Therefore, when a communication scheme such as a WDM is employed, it is possible to increase the number of the wavelength channels and achieve a high speed transmission rate.

(Fifth Embodiment)

Figure 8:
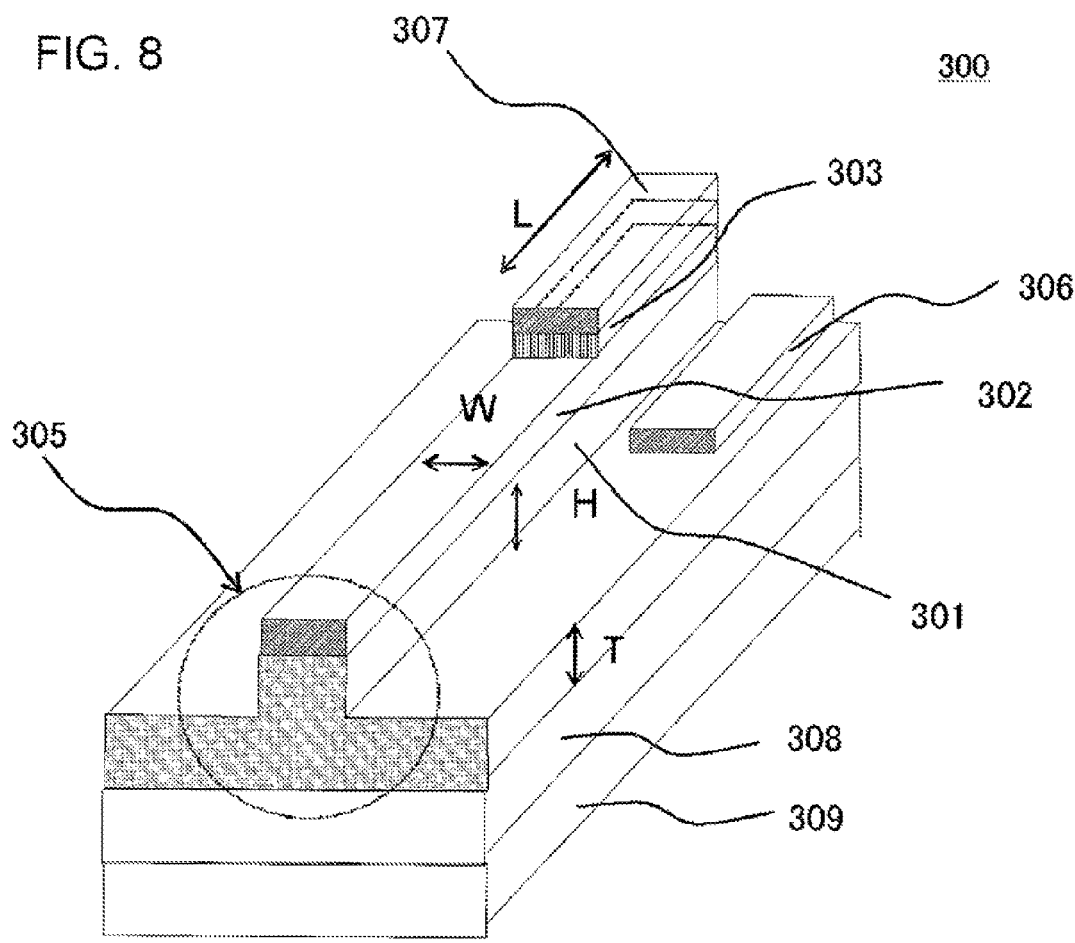
FIG. 8 is a perspective diagram illustrating a configuration of a semiconductor light-receiving element 300 according to the fifth embodiment.

FIG. 8 is a perspective view illustrating a semiconductor light-receiving element 300 according to the fifth embodiment. The semiconductor light-receiving element 300 according to the present embodiment is similar to that of the first embodiment except that the first conductivity-type is a p-type, the second conductivity-type is an n-type, and the second conductivity-type Si layer 304 is not provided.

According to the present embodiment, since a contact resistance between the light-absorption layer 303 and the electrode 307 is low without the second conductivity-type Si layer 304, it is possible to obtain the same effect as that of the first embodiment. In addition, since the second conductivity-type Si layer 304 is not provided, the number of manufacturing processes is reduced.

(Sixth Embodiment)

Figure 9:
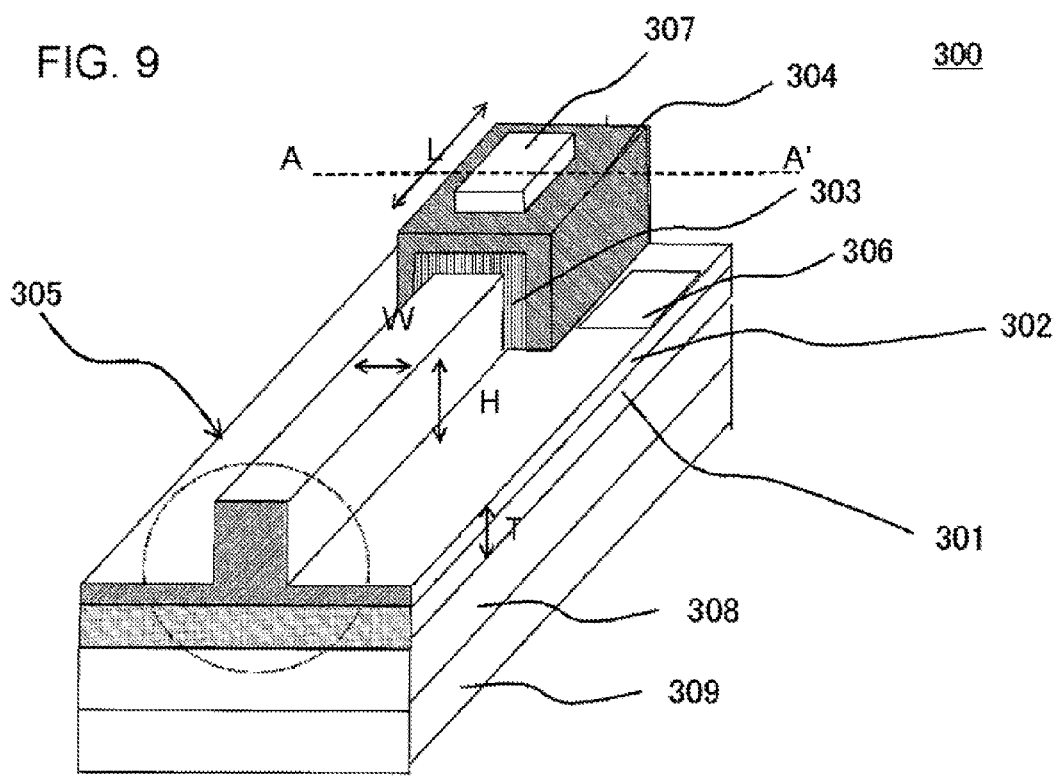
FIG. 9 is a perspective diagram illustrating a configuration of a semiconductor light-receiving element 300 according to the sixth embodiment.
Figure 10:
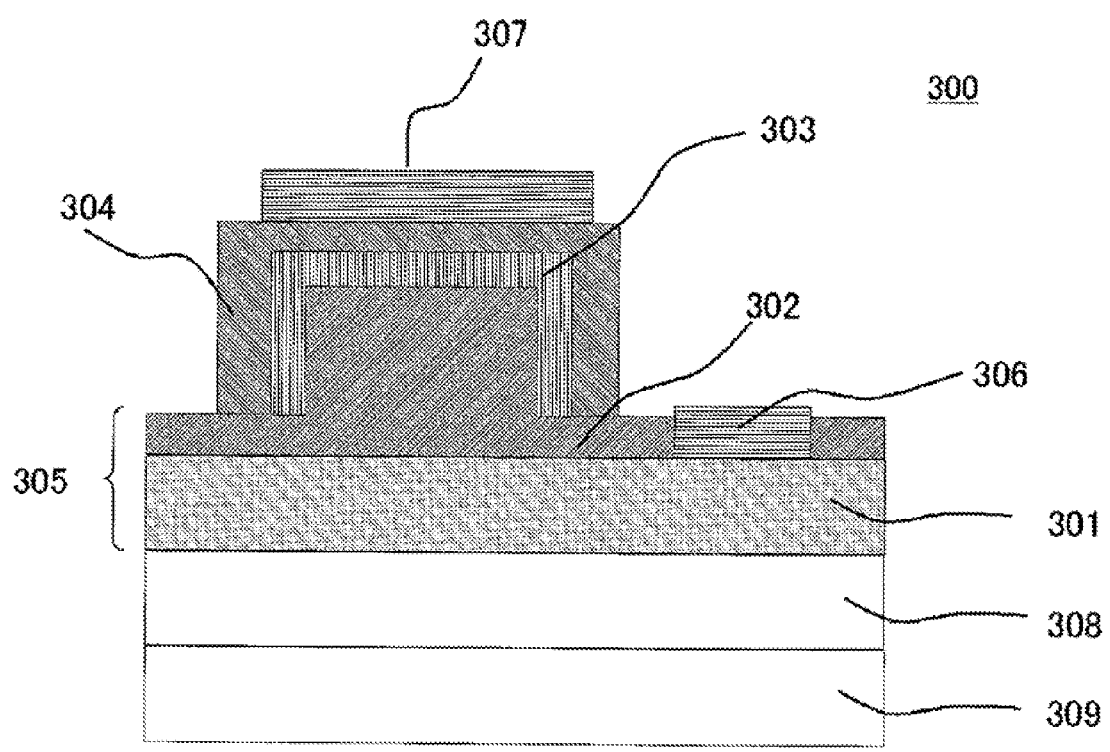
FIG. 10 is a cross-sectional view taken along a line A-A' of FIG. 9.
Figure 11:
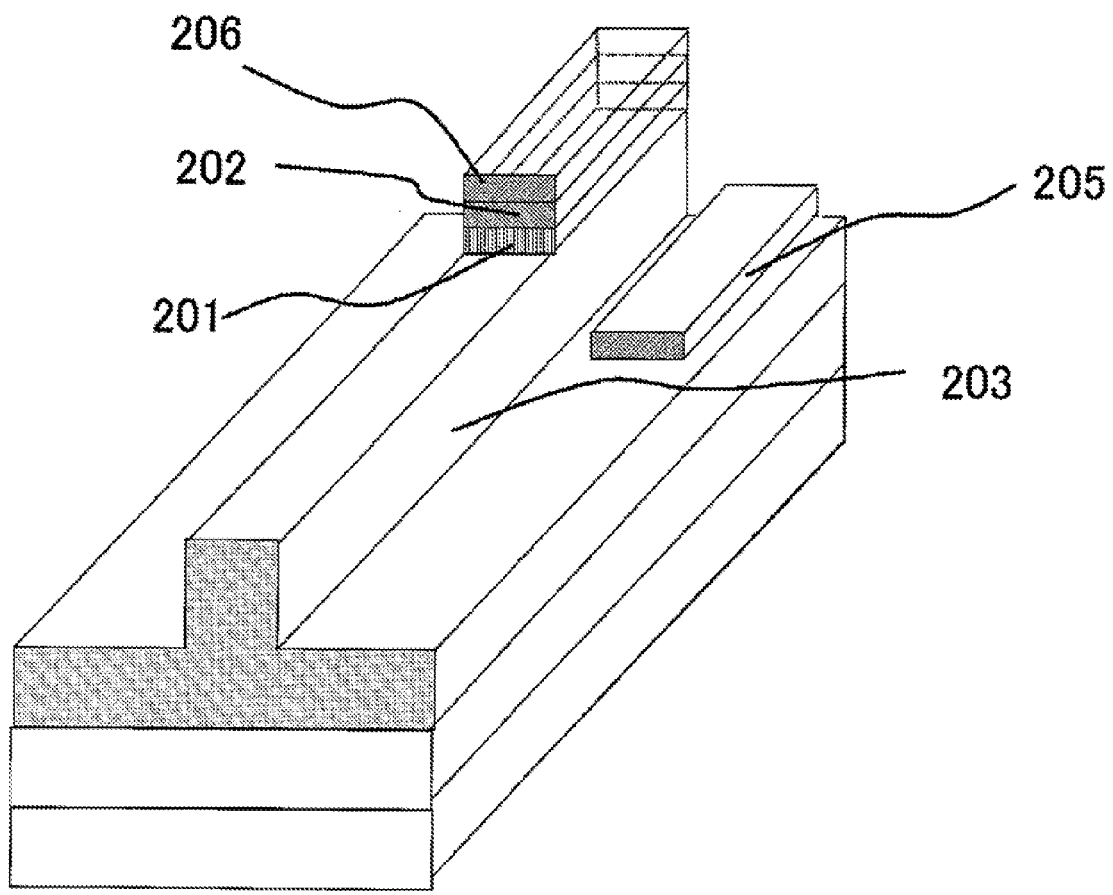
FIG. 11 is a perspective diagram illustrating a light-receiving element described in Non-patent Document 1.

FIG. 9 is a perspective view illustrating a semiconductor light-receiving element 300 according to the sixth embodiment, and FIG. 10 is a cross-sectional view taken along the line A-A' of FIG. 9. The semiconductor light-receiving element 300 according to the present embodiment is similar to that of the first embodiment except that the convex portion is not provided on the first conductivity-type Si layer 301, the intrinsic Si layer 302 is formed on the entire surface of the first conductivity-type Si layer 301, a convex portion is provided on the intrinsic Si layer 302, the light-absorption layer 303 is provided on the upper surface of the convex portion of the intrinsic Si layer 302 and both side faces, and the second conductivity-type Si layer 304 is formed following the upper surface shape of the light-absorption layer 303, and the electrode 306 is connected to the first conductivity-type Si layer 301 while buried in the intrinsic Si layer 302.

According to the present invention, it is possible to obtain the same effect as that of the first embodiment. In addition, since the convex portion is formed on the intrinsic Si layer 302, and the light-absorption layer 303 is formed on the upper surface of the convex portion and both side faces of the intrinsic Si layer 302, the signal light guided by the Si waveguide 305 can be easily exuded from the light-absorption layer 303, and the length L of the light-absorption layer 303 can be shortened. As a result, it is possible to further reduce the size of the element.

While the embodiments of the invention have been described with reference to the drawings, these are exemplary, and various configurations may be employed in addition to those described above. For example, in the embodiments described above, the intrinsic Si layer 302 is not necessarily formed on the entire waveguide 305, but may be formed only in an area of the semiconductor light-receiving element 300.

This application is the National Phase of PCT/JP2009/000991, filed Mar. 5, 2009, which claims benefits of a priority of Japanese Patent Application No. 2008-087574, filed Mar. 28, 2008, of which the entirety is incorporated herein by reference.

The invention claimed is:

1. A semiconductor light-receiving element comprising:
   a Si waveguide obtained by stacking a first conductivity-type Si layer and an intrinsic Si layer; and
   a light-absorption layer stacked on a part of an area of the intrinsic Si layer and made of any one of a second conductivity-type Ge, a second conductivity-type SiGe, and a multi-layer film obtained by alternately stacking a second conductivity-type Ge layer and a second conductivity-type Si layer.

2. The semiconductor light-receiving element according o claim 1, further comprising:
   a second conductivity-type Si layer formed on said light-absorption layer; and
   an electrode formed on said second conductivity-type Si layer.

3. The semiconductor light-receiving element according to claim 1,
   wherein signal light to be received is converted into an electric current in said light-absorption layer while being guided by said Si waveguide underlying said light-absorption layer.

4. The semiconductor light-receiving element according to claim 1,
   wherein an impurity concentration of said light-absorption layer in the vicinity of an interface in contact with said intrinsic Si layer is lower than that in the vicinity of an interface of an opposite side to the interface in contact with the intrinsic Si layer.

5. The semiconductor light-receiving element according to claims 1,
   wherein said first conductivity-type is a p-type, said second conductivity-type is an n-type, and a thickness of said intrinsic Si layer is equal to or smaller than 200 nm.

6. The semiconductor light-receiving element according to claim 1,
   wherein a cover layer that envelops a circumference of said light-absorption layer and is made of a material including a thermal expansion rate smaller than a thermal expansion rate of the light-absorption layer, is provided on said intrinsic Si layer.

7. The semiconductor light-receiving element according to claim 6,
   wherein said cover layer is made of Si and has a second conductivity-type area formed on a part of said cover layer.

8. The semiconductor light-receiving element according to claim 1,
   wherein said intrinsic Si layer is depleted while said semiconductor light-receiving element is operated.

* * * * *